United States Patent
Lavedas et al.

(10) Patent No.: US 11,585,840 B2
(45) Date of Patent: Feb. 21, 2023

(54) TUNING OF NARROWBAND NEAR-FIELD PROBES

(71) Applicant: Raytheon Company, Waltham, MA (US)

(72) Inventors: Thomas G. Lavedas, Moneta, VA (US); David G. Penn, Centreville, VA (US)

(73) Assignee: Raytheon Company, Waltham, MA (US)

( * ) Notice: Subject to any disclaimer, the term of this patent is extended or adjusted under 35 U.S.C. 154(b) by 258 days.

(21) Appl. No.: 17/011,986

(22) Filed: Sep. 3, 2020

(65) Prior Publication Data

US 2022/0065911 A1    Mar. 3, 2022

(51) Int. Cl.
*G01R 27/28* (2006.01)
*G01R 27/26* (2006.01)
*H03F 3/24* (2006.01)

(52) U.S. Cl.
CPC ..... *G01R 27/2676* (2013.01); *G01R 27/2641* (2013.01); *H03F 3/245* (2013.01); *H03F 2200/451* (2013.01)

(58) Field of Classification Search
CPC ... G01R 27/2641; G01R 27/2676; H03F 1/56; H03F 3/245; H03F 3/2171; H03F 3/2176; H03F 2200/306; H03F 2200/387; H03F 2200/391; H03F 2200/399; H03F 2200/426; H03F 2200/451; H02J 50/005; H02J 50/12
See application file for complete search history.

(56) References Cited

U.S. PATENT DOCUMENTS 9,292,782 B2 *   3/2016   Savoj ............... G06K 19/07749
10,237,000 B1 *   3/2019   Buchsbaum ............. H04B 5/02
(Continued)

FOREIGN PATENT DOCUMENTS

WO    2020069198 A1    4/2020

OTHER PUBLICATIONS

International Search Report and Written Opinion of the International Searching Authority in connection with International Patent Application No. PCT/US2021/042777 dated Oct. 25, 2021, 12 pages.

(Continued)

*Primary Examiner* — Thang X Le

(57) ABSTRACT

An apparatus includes a near-field probe having loops or coils of electrically-conductive material, where the near-field probe is configured to generate a magnetic field. The apparatus also includes a power amplifier configured to drive the near-field probe. The apparatus further includes a shunt capacitance coupled in parallel across the loops or coils of the near-field probe. The shunt capacitance and an inductance of the loops or coils of the near-field probe form part of a resistive-inductive-capacitive (RLC) network. The RLC network is configured to transform a smaller resistance of the near-field probe into a larger resistance. In some cases, the apparatus may include multiple near-field probes coupled in series, and the power amplifier may be configured to drive the multiple near-field probes. For each near-field probe, the apparatus may include a shunt capacitance coupled in parallel across the loops or coils of the near-field probe.

20 Claims, 4 Drawing Sheets

(56) References Cited

U.S. PATENT DOCUMENTS

| | | | |
|---|---|---|---|
| 10,249,946 B2* | 4/2019 | Meziache | H03H 7/40 |
| 10,778,046 B2* | 9/2020 | Ikefuji | H02J 50/12 |
| 2009/0325488 A1* | 12/2009 | Seol | G06K 7/10237 |
| | | | 340/10.51 |
| 2013/0033118 A1 | 2/2013 | Karalis et al. | |
| 2014/0001882 A1* | 1/2014 | Cook | H03F 3/2176 |
| | | | 307/104 |
| 2016/0181853 A1* | 6/2016 | Yang | H02J 50/005 |
| | | | 320/108 |
| 2019/0067818 A1* | 2/2019 | Cordier | H01Q 9/045 |
| 2020/0044615 A1 | 2/2020 | Walling et al. | |
| 2021/0018374 A1* | 1/2021 | Herceg | G01K 3/005 |
| 2021/0359551 A1* | 11/2021 | Yankowitz | H03F 3/195 |

OTHER PUBLICATIONS

Yang, "High Frequency Helmholtz Coils Generates Magnetic Field", Passive Components Blog, Jan. 2016, 7 pages.

* cited by examiner

TUNING OF NARROWBAND NEAR-FIELD PROBES

TECHNICAL FIELD

This disclosure relates generally to near-field sensors. More specifically, this disclosure relates to tuning of narrowband near-field probes.

BACKGROUND

Near-field sensors can be used in a number of applications, such as radio frequency identification (RFID) systems and radio frequency (RF) spectroscopy sensors. Near-field sensors often include probes formed using electrically-conductive loops or coils, which are used to generate local magnetic fields. A tuning-matching network is also typically used to at least substantially match the inherent impedance of a near-field sensor's probe to that of its driving power amplifier over a limited bandwidth, such as 50 ohms. This can help to increase or maximize the amount of power from the power amplifier that is provided into the near-field sensor's probe.

SUMMARY

This disclosure provides for tuning of narrowband near-field probes.

In a first embodiment, an apparatus includes a near-field probe having loops or coils of electrically-conductive material, where the near-field probe is configured to generate a magnetic field. The apparatus also includes a power amplifier configured to drive the near-field probe. The apparatus further includes a shunt capacitance coupled in parallel across the loops or coils of the near-field probe. The shunt capacitance and an inductance of the loops or coils of the near-field probe form part of a resistive-inductive-capacitive (RLC) network. The RLC network is configured to transform a smaller resistance of the near-field probe into a larger resistance.

In a second embodiment, an apparatus includes multiple near-field probes coupled in series, where each near-field probe includes loops or coils of electrically-conductive material and is configured to generate a magnetic field. The apparatus also includes a power amplifier configured to drive the near-field probes. The apparatus further includes, for each near-field probe, a shunt capacitance coupled in parallel across the loops or coils of the near-field probe. The shunt capacitance and an inductance of the loops or coils of the near-field probe form part of an RLC network. The RLC network is configured to transform a smaller resistance of the near-field probe into a larger resistance.

In a third embodiment, a method includes amplifying an excitation signal to generate a drive signal for one or more near-field probes, where each near-field probe includes loops or coils of electrically-conductive material. The method also includes generating a magnetic field using each near-field probe based on the drive signal. The method further includes, for each near-field probe, using a shunt capacitance coupled in parallel across the loops or coils of the near-field probe to form, along with an inductance of the loops or coils of the near-field probe, part of an RLC network. The RLC network is configured to transform a smaller resistance of the near-field probe into a larger resistance.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
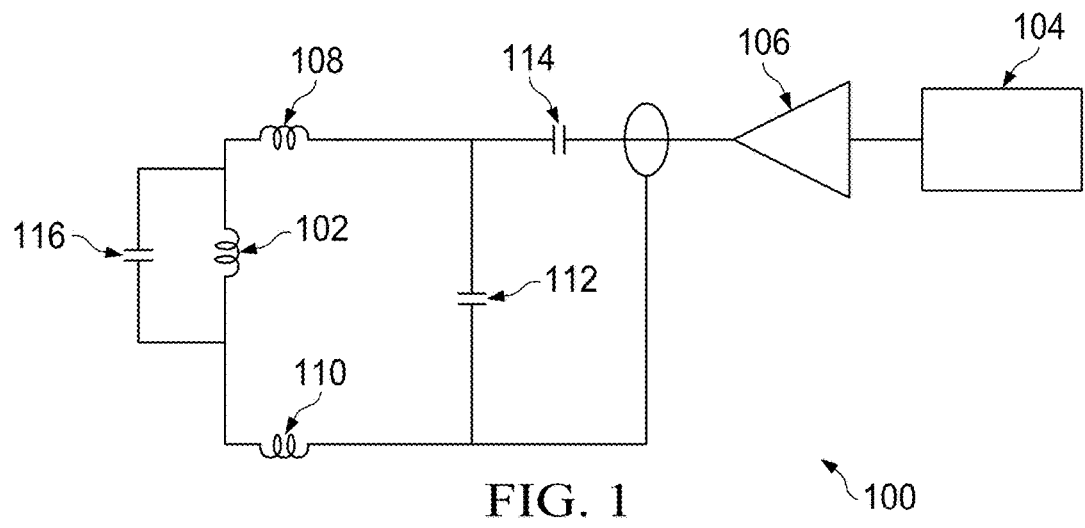
FIG. 1 illustrates a first example system supporting tuning of a narrowband near-field probe in accordance with this disclosure.

FIGS. 1 through 5, described below, and the various embodiments used to describe the principles of the present disclosure are by way of illustration only and should not be construed in any way to limit the scope of the disclosure. Those skilled in the art will understand that the principles of the present disclosure may be implemented in any type of suitably arranged device or system.

As noted above, near-field sensors can be used in a number of applications, such as radio frequency identification (RFID) systems and radio frequency (RF) spectroscopy sensors. Near-field sensors often include probes formed using electrically-conductive loops or coils, which are used to generate local magnetic fields. A tuning-matching network is also typically used to at least substantially match the inherent impedance of a near-field sensor's probe to that of its driving power amplifier over a limited bandwidth, such as 50 ohms. This can help to increase or maximize the amount of power from the power amplifier that is provided into the near-field sensor's probe.

One common tuning-matching network can be formed using an L-network of two capacitors, where one capacitor is coupled in parallel with the inductance of a near-field probe and another capacitor is coupled in series with the inductance of the near-field probe. These two passive elements act to cancel the reactance of the near-field probe and transform the generally-small resistance of the near-field probe's impedance to at least substantially match that of a power amplifier. However, in some cases, the magnetic fields that are generated using near-field probes can be very strong in order to perform desired functions. To achieve the needed or desired magnetic field strengths, capacitors and other components of the tuning-matching network may need to endure large currents and voltages, such as currents of 100 A or more and voltages of 10 kV or more. Unfortunately, this can create large stresses in the capacitors or other components of the tuning-matching network.

Moreover, multiple near-field probes may be coupled in series with one another and used in certain applications, such as in cargo or vehicle inspection systems where items being inspected are transported between the near-field probes through a sensing area. For example, a pair of near-field probes may be spaced apart and fed with high power from a single source, and cables can be passed between the near-field probes to connect them in series. In some cases, these types of systems may be configured as two-sided Helmholtz coils. Unfortunately, the current and voltage crossing the sensing area or otherwise passing between the near-field probes can become high. These types of systems can have large electrical losses, such as when long cables are needed to connect the near-field probes to each other or to signal sources or other components. Large electrical losses may also exist in some single-probe applications, such as when there is a large distance and therefore at least one lengthy cable between a near-field probe and its signal source.

In addition, some near-field probes may need to support the use of multiple operational frequencies, which adds a requirement to change the values of various components in the tuning-matching networks. In some cases, this is accomplished using mechanical or electromechanical switches. However, these switches are often subjected to large electrical currents when closed and to high electrical voltages when opened (even when not switched under power). These requirements can substantially increase the complexity and cost of an overall system while having an adverse effect on reliability.

This disclosure provides various approaches for tuning of narrowband near-field probes. As described in more detail below, a parallel shunt capacitance may be used with each of one or more near-field probes, such as when a shunt capacitance is placed immediately at the input or feed terminal of each near-field probe. A shunt capacitance that is placed in parallel with an inductance inherent in the electrically-conductive loops or coils of a near-field probe helps to form a high-Q resistive-inductive-capacitive (RLC) network, which acts to cause larger currents to flow in the RLC network when a drive voltage is applied (relative to an amount of current flowing through the near-field probe without the shunt capacitance in response to the same drive voltage). Essentially, this causes the very small resistance of a high-Q near-field probe to be transformed into a higher resistance. As a result, the resistance of one or more electrical cables used with the near-field probe have a smaller effect relative to the resistance of the near-field probe itself, which helps to reduce electrical losses in the system as a whole. Thus, the presence of a shunt capacitance across a near-field probe can help to dramatically reduce the electrical current carried by a cable coupled to the near-field probe while maintaining the overall magnetic field strength produced by the near-field probe. This can also help to reduce the current and voltage that need to be accommodated in crossing cables if multiple probes are used.

In some embodiments, an additional capacitance can also be placed in series with one or more near-field probes. The additional series capacitance can be applied to the input or feed of the one or more near-field probes. The additional series capacitance causes a rise in voltage from a driving power amplifier toward the input terminal(s) of the near-field probe(s). As a result, matching elements that are used in a tuning-matching network can be subjected to lower voltages, thereby reducing the stresses placed on those components. The matching elements can still be used to transform the terminal impedance of the near-field probe(s) into an impedance level that at least substantially matches the inherent impedance of a driving power amplifier, which helps to provide improved or maximum power transfer from the power amplifier to the near-field probe(s).

FIG. 1 illustrates a first example system 100 supporting tuning of a narrowband near-field probe in accordance with this disclosure. Note that resistances inherent in all of the components are assumed but not illustrated for clarity. As shown in FIG. 1, the system 100 includes a near-field probe 102, a probe excitation unit 104, and a power amplifier 106. The near-field probe 102 represents a structure that is configured to generate a local magnetic field in the vicinity of the near-field probe 102. In some embodiments, the local magnetic field may interact with RFID tags or other RFID devices in order to support radio frequency identification operations. In other embodiments, the local magnetic field may interact with one or more materials near the near-field probe 102 in order to support RF spectroscopy operations. Note, however, that any other or additional operations may occur using the near-field probe 102. In general, this disclosure is not limited to any particular use of the near-field probe 102.

The near-field probe 102 may be formed from any suitable electrically-conductive material(s), such as one or more metals. In some embodiments, the near-field probe 102 may be formed using multiple loops or coils of the electrically-conductive material(s). The near-field probe 102 is illustrated here as having the form of an inductor to represent the inherent inductance of the loops or coils. The near-field probe 102 may also have any suitable size, shape, and dimensions. For instance, the near-field probe 102 may be formed using any suitable number of loops or coils. In general, this disclosure is not limited to any particular form of the near-field probe 102.

The probe excitation unit 104 represents at least one component that produces an excitation signal for the near-field probe 102, where the excitation signal is then amplified by the power amplifier 106 in order to drive the near-field probe 102. The probe excitation unit 104 includes any suitable source of at least one signal used to excite a near-field probe 102, such as an RF source. The power amplifier 106 includes any suitable structure configured to amplify one or more signals, such as an RF power amplifier.

In this example, the power amplifier 106 is electrically coupled to the near-field probe 102 using cables 108 and 110. The cables 108 and 110 represent any suitable electrical conductors configured to electrically connect the near-field probe 102 and the power amplifier 106. As noted above, in some cases, the cable 108 and/or the cable 110 may be quite long.

An L-network formed using capacitors 112 and 114 represents a tuning-matching network for the near-field probe 102. The capacitor 112 is coupled in parallel with the near-field probe 102, and the capacitor 114 is coupled in series with the near-field probe 102. The capacitors 112 and 114 are also coupled to each other in an L-shaped configuration. The capacitors 112 and 114 are used to at least substantially cancel the reactance of the near-field probe 102 and transform the generally-small resistance of the probe's impedance to at least substantially match that of the power amplifier 106. More specifically, the capacitor 112 is used to raise the impedance of the small resistive part of the probe's impedance to at least substantially match that of the power amplifier 106. This also results in increasing the inductive part of the probe's impedance, which is at least substantially cancelled at a single frequency by selecting the proper value for the capacitor 114. As a result, the impedance presented to the power amplifier 106 as its load is at least substantially matched to the power amplifier's source impedance over a band of frequencies. Each capacitor 112 and 114 includes any suitable capacitive structure configured to provide any suitable capacitance. Note that while two capacitors 112 and 114 are shown here, each capacitor 112 and 114 may be implemented using a single capacitor or multiple capacitors in any suitable arrangement.

In achieving a matched condition of the near-field probe 102 to the power amplifier 106, the electrical current passing through the reactance of the series capacitor 114 causes the voltage to rise significantly at the capacitor's output end (its left end in FIG. 1). This large voltage results in a large current circulating through the nearly-resonant tank circuit formed by the impedance of the near-field probe 102 in parallel with the reactance of the capacitor 112. These voltages and currents are increased by the "quality factor" of the circuit over that present at the output of the power amplifier 106. The quality factor (denoted Q) is defined as a ratio of an amount of energy stored in a circuit to the power dissipated in the circuit. Since it is not uncommon for a well-designed transmit probe to exhibit a Q value in excess of 100, it can be seen that the currents and voltages in the circuit can be very great.

Vacuum capacitors that support very high voltages and currents are available and are specifically designed for these types of applications. However, the use of vacuum capacitors only provides a good match over a narrow band of frequencies. To support operation over a significant band or set of frequencies, some mechanism for varying the values of the two capacitors 112 and 114 of the matching network would be used. For instance, switches may be used to select different capacitors for inclusion or removal from the circuit to achieve a match at different frequencies, or some other variable component(s) may be used. However implemented, the current- and voltage-handling capabilities of such components may result in very costly solutions. For instance, capacitors and other components may need to endure large currents and voltages, such as currents of 100 A or more and voltages of 10 kV or more, and components that can withstand these very high voltages and currents are costly.

As shown in FIG. 1, the system 100 uses a shunt capacitor 116, which is placed in parallel across the near-field probe 102. In some embodiments, the shunt capacitor 116 may be coupled to a feed or input terminal and to an output terminal of the near-field probe 102. Note that the shunt capacitor 116 here represents an additional capacitance in the system 100 and does not merely represent the parasitic self-capacitance of the near-field probe 102.

The presence of the shunt capacitor 116 in parallel with the inductance inherent in the near-field probe 102 form a high-Q RLC network. The RLC network causes a larger amount of current to flow through the near-field probe 102 (higher relative to an amount of current that would flow through the near-field probe 102 without the shunt capacitor 116 in response to the same drive voltage). The RLC network also transforms the very small resistance of the near-field probe 102 into a higher resistance. Because of this, the resistance of the network formed by the near-field probe 102 and the capacitor 116 is higher relative to the resistances of the cables 108 and 110. As a particular example, assume the impedance of the near-field probe 102 normally (without the capacitor 116) has a resistive component of 100 milliohms. If the cables 108 and 110 have a combined resistance of 20 milliohms, the cables 108 and 110 themselves represent a 20% loss to the circuit. However, the RLC circuit that is formed in part by the capacitor 116 may easily raise the resistive part of the impedance of the near-field probe 102 to one ohm (assuming the Q value of the capacitor 116 is suitably high). In that case, the 20 milliohm resistive component of the cables 108 and 110 represents only a two percent increase in the total loss of the circuit. This helps to reduce electrical losses present in the cables 108 and 110. This also helps to reduce the electrical current carried by the cables 108 and 110 coupled to the near-field probe 102 while maintaining the overall magnetic field strength produced by the near-field probe 102.

The capacitor 116 includes any suitable capacitive structure configured to provide any suitable capacitance. Note that while a single capacitor 116 is shown here, the capacitor 116 may be implemented using a single capacitor or multiple capacitors in any suitable arrangement.

Figure 2:
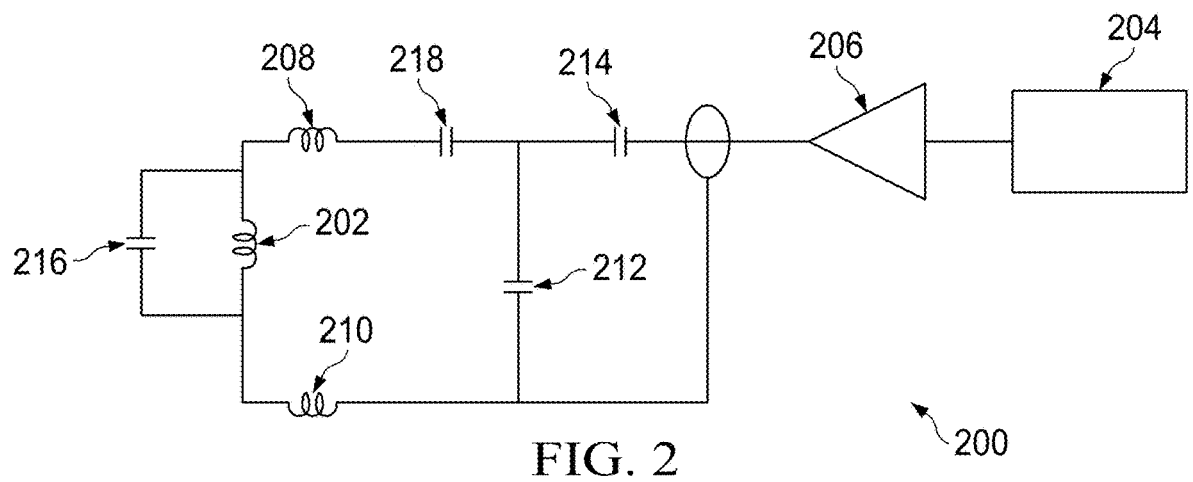
FIG. 2 illustrates a second example system supporting tuning of a narrowband near-field probe in accordance with this disclosure.

FIG. 2 illustrates a second example system 200 supporting tuning of a narrowband near-field probe in accordance with this disclosure. As shown in FIG. 2, the system 200 includes various components 202-216 that may be the same as or similar to corresponding components 102-116 in the system 100 of FIG. 1. As described above, the addition of the parallel capacitor 116 across the near-field probe 102 acts to reduce the current flowing in the cables 108 and 110. However, the capacitor 116 does not reduce the voltages on the capacitors 112 and 114 in the tuning-matching network.

In FIG. 2, this is accomplished by adding a capacitor 218 in series with the near-field probe 202. The presence of the capacitor 218 in series with the near-field probe 202 here causes a rise in voltage from the power amplifier 206 toward the input terminal of the near-field probe 202. However, since the higher voltage is provided by the capacitor 218, the higher voltage is not experienced by the capacitors 212 and 214 of the tuning-matching network. Thus, stresses on the capacitors 212 and 214 of the tuning-matching network are reduced. The capacitors 212 and 214 can still be used to at least substantially match the terminal impedance of the near-field probe 202 with the inherent impedance of the power amplifier 206.

The capacitor 218 includes any suitable capacitive structure configured to provide any suitable capacitance. Note that while a single capacitor 218 is shown here, the capacitor 218 may be implemented using a single capacitor or multiple capacitors in any suitable arrangement. In some embodiments, the capacitance of the capacitor 218 can be determined by dividing the desired voltage drop across the capacitor 218 to be implemented by the current to be delivered through the capacitor 218 to the near-field probe 202. This yields the capacitive reactance for the capacitor 218 at its desired operating frequency, and the value of the capacitance for the capacitor 218 can be easily calculated from the reactance value.

Figure 3:
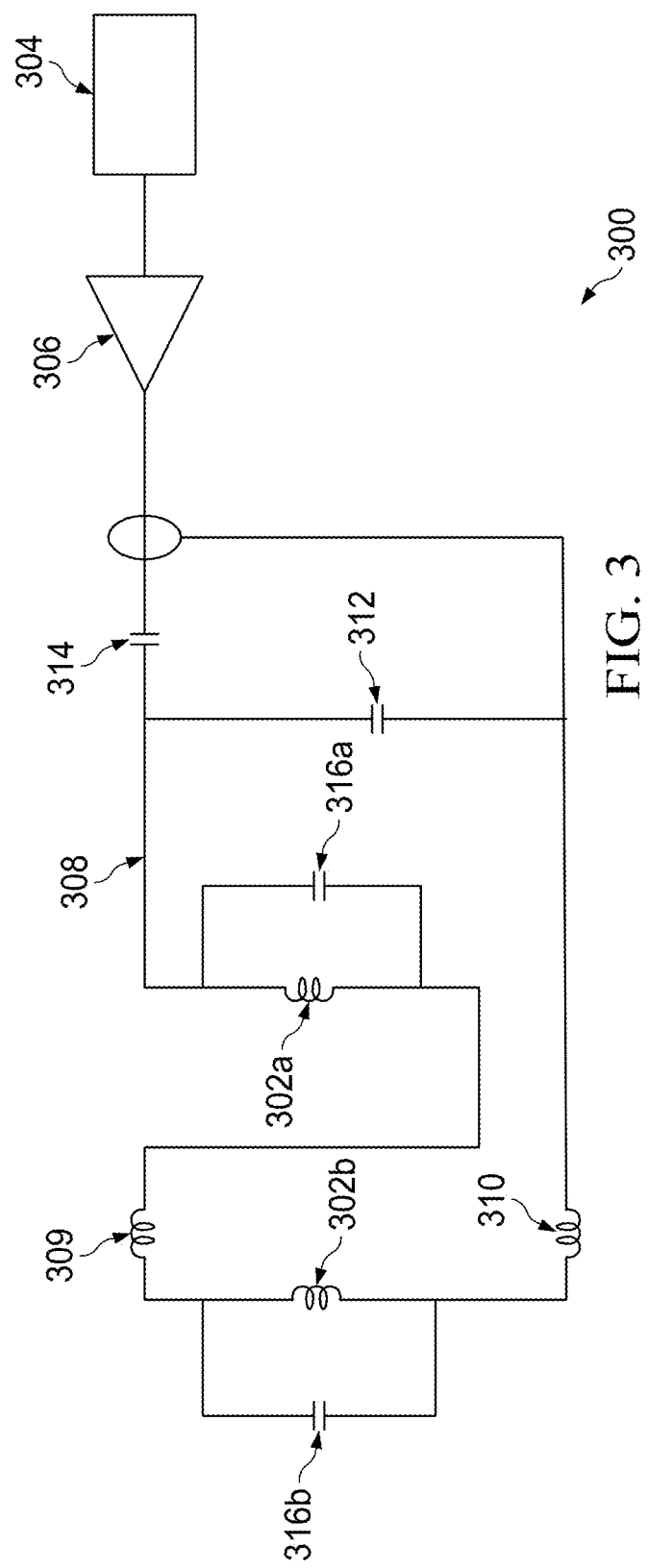
FIG. 3 illustrates a first example system supporting multi-stage tuning of multiple narrowband near-field probes in accordance with this disclosure.

FIG. 3 illustrates a first example system 300 supporting multi-stage tuning of multiple narrowband near-field probes in accordance with this disclosure. As shown in FIG. 3, the system 300 includes multiple near-field probes 302a-302b, a probe excitation unit 304, and a power amplifier 306. Each near-field probe 302a-302b represents a structure that is configured to generate a local magnetic field in the vicinity of the near-field probe 302a-302b. Each near-field probe 302a-302b may be the same as or similar to the near-field probes 102 and 202 discussed above. The probe excitation unit 304 includes any suitable source of at least one signal used to excite multiple near-field probes 302a-302b, such as an RF source. The probe excitation unit 304 may be the same as or similar to the probe excitation units 104 and 204 discussed above. The power amplifier 306 includes any suitable structure configured to amplify one or more signals, such as an RF power amplifier. The power amplifier 306 may be the same as or similar to the power amplifiers 106 and 206 discussed above.

In this example, the near-field probes 302a-302b are coupled in series using cables 308, 309, and 310. More specifically, the cable 308 is coupled to the first near-field probe 302a, the cable 309 couples the near-field probes 302a-302b together, and the cable 310 is coupled to the second near-field probe 302b. The cables 308, 309, and 310 represent any suitable electrical conductors. As noted above, in some cases, the cable(s) 308, 309, and/or 310 may be quite long.

An L-network formed using capacitors 312 and 314 represents a tuning-matching network for the near-field probes 302a-302b. Each capacitor 312 and 314 includes any suitable capacitive structure configured to provide any suitable capacitance. The capacitors 312 and 314 may be the same as or similar to the capacitors 112 and 114 or the capacitors 212 and 214 discussed above. Note that while two capacitors 312 and 314 are shown here, each capacitor 312 and 314 may be implemented using a single capacitor or multiple capacitors in any suitable arrangement.

As with the systems 100 and 200, the high-Q nature of the system 300 can lead to the creation of large voltages and currents in the circuit. However, this problem is further complicated when multiple near-field probes are used. For example, the need to couple multiple near-field probes 302a-302b together in series using additional cables can create additional electrical losses, which adversely affect the efficiency of the system 300.

In FIG. 3, the system 300 uses shunt capacitors 316a-316b, which are placed in parallel across the near-field probes 302a-302b, respectively. In some embodiments, each shunt capacitor 316a-316b may be coupled to a feed or input terminal and to an output terminal of the associated near-field probe 302a-302b. Again, note that each shunt capacitor 316a-316b here represents an additional capacitance in the system 300 and does not merely represent the parasitic self-capacitance of the associated near-field probe 302a-302b.

The presence of the shunt capacitors 316a-316b in parallel with the inductances inherent in the near-field probes 302a-302b form high-Q RLC networks. These RLC networks transform the very small resistances of the near-field probes 302a-302b into higher resistances. Because of this, the resistances of the networks formed by the near-field probes 302a-302b and the capacitors 316a-316b are higher relative to the resistances of the cables 308-310, which helps to reduce electrical losses in the cables 308-310. This also helps to reduce the electrical current carried by the cables 308-310 coupled to the near-field probes 302a-302b (including in the connecting cable 309 coupling the near-field probes 302a-302b) while maintaining the overall magnetic field strengths produced by the near-field probes 302a-302b.

Each capacitor 316a-316b includes any suitable capacitive structure configured to provide any suitable capacitance. Note that while a single capacitor 316a and a single capacitor 316b are shown here, each capacitor 316a-316b may be implemented using a single capacitor or multiple capacitors in any suitable arrangement.

Note that the addition of the capacitors 316a-316b to the circuit changes the system 300 from a third-order circuit to a seventh-order circuit. That is, the system 300 may have originally had three resonances but, with the addition of the capacitors 316a-316b, now has seven resonances. Ordinarily, use of a seventh-order circuit would be avoided since it is hard to design, hard to tune, and unlikely to achieve stable operation. However, the approach shown in FIG. 3 is both tunable and stable when properly designed. Thus, by limiting the values of the capacitors 316a-316b, additional resonances can be kept well-above the designed operating band of the system 300, which limits the possibility of introducing undesired interactions between these several resonances. The values of the capacitors 316a-316b can be limited to achieving a desired increase in the resistive component of each near-field probe's impedance relative to the resistance of the cables 308-310.

Figure 4:
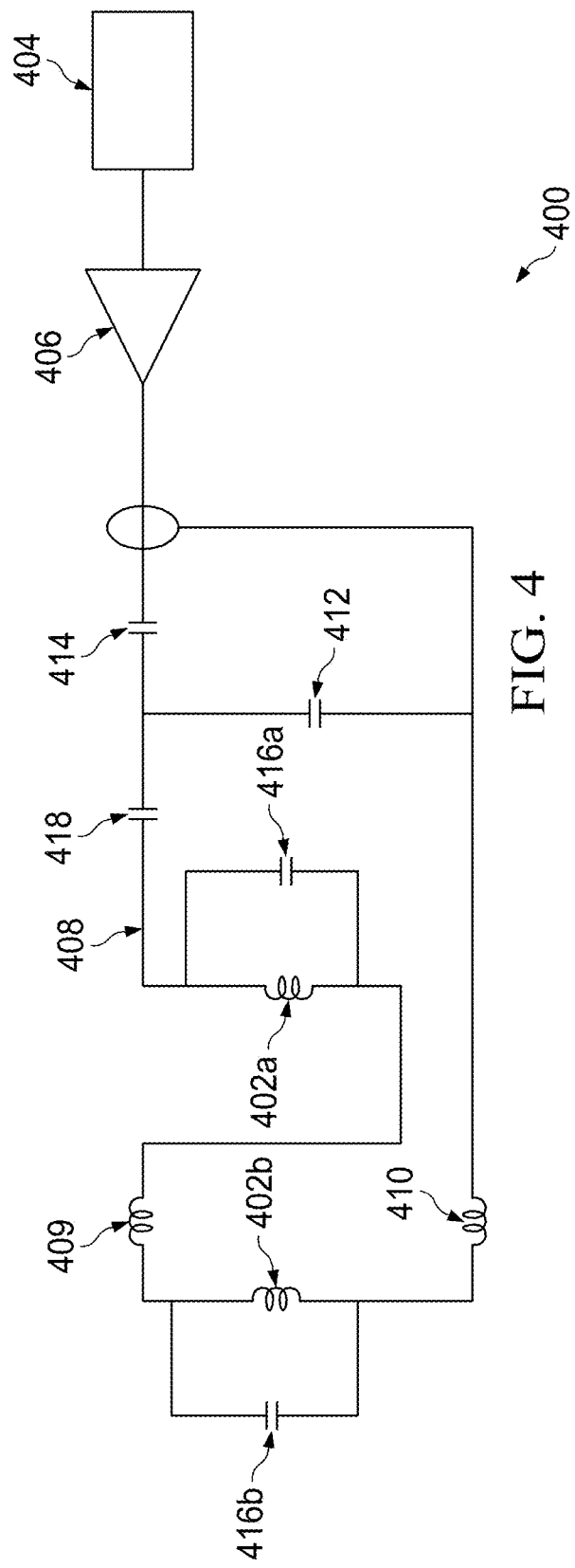
FIG. 4 illustrates a second example system supporting multi-stage tuning of multiple narrowband near-field probes in accordance with this disclosure.

FIG. 4 illustrates a second example system 400 supporting multi-stage tuning of multiple narrowband near-field probes in accordance with this disclosure. As shown in FIG. 4, the system 400 includes various components 402a-416b that may be the same as or similar to corresponding components 302a-316b in the system 300 of FIG. 3. As described above, the addition of the parallel capacitors 316a-316b across the near-field probes 302a-302b acts to reduce the current flowing in the cables 308-310. However, the capacitors 316a-316b do not reduce the voltages on the capacitors 312 and 314 in the tuning-matching network. This can be more of an issue here since increasing the number of near-field probes increases the voltage across the capacitors 412 and 414 of the tuning-matching network. For instance, doubling the number of near-field probes can double the voltage across the capacitors 312 and 314 of the tuning-matching network.

In FIG. 4, a capacitor 418 is added in series with the near-field probes 402a-402b. The presence of the capacitor 418 in series with the near-field probes 402a-402b here causes a rise in voltage from the power amplifier 406 toward the input terminals of the near-field probes 402a-402b. The higher voltage is provided by the capacitor 418 but is not experienced by the capacitors 412 and 414 of the tuning-matching network. Again, this reduces stresses on the capacitors 412 and 414 of the tuning-matching network. The capacitors 412 and 414 can still be used to at least substantially match the terminal impedance of the near-field probes 402a-402b with the inherent impedance of the power amplifier 406.

The capacitor 418 includes any suitable capacitive structure configured to provide any suitable capacitance. Note that while a single capacitor 418 is shown here, the capacitor 418 may be implemented using a single capacitor or multiple capacitors in any suitable arrangement. In some embodiments, the capacitance of the capacitor 418 can be determined by dividing the desired voltage drop across the capacitor 418 to be implemented by the current to be delivered through the capacitor 418 to the near-field probes 402a-402b. This yields the capacitive reactance for the capacitor 418 at its desired operating frequency, and the value of the capacitance for the capacitor 418 can be easily calculated from the reactance value.

Properly selecting the values for the various capacitors 116, 216 and 218, 316a-316b, or 416a-416b and 418 can reduce both the electrical voltage and the electrical current experienced by the capacitors 112 and 114, 212 and 214, 312 and 314, or 412 and 414 in the tuning-matching network. For example, properly selecting the values for the various capacitors 416a-416b and 418 in FIG. 4 may reduce the current in the L-network by a factor of about three or more and reduce the voltage in the L-network by about half or more. This can greatly reduce the stresses placed on the capacitors of the L-network. The values for the capacitors can be determined as described above in order to obtain these benefits.

Although FIGS. 1 through 4 illustrate example systems supporting tuning of one or more narrowband near-field probes, various changes may be made to FIGS. 1 through 4. For example, various circuit components in any of FIGS. 1 through 4 may be replaced with suitable equivalent circuit components. Also, while FIGS. 3 and 4 show two near-field probes being used, a system may include more than two near-field probes.

Figure 5:
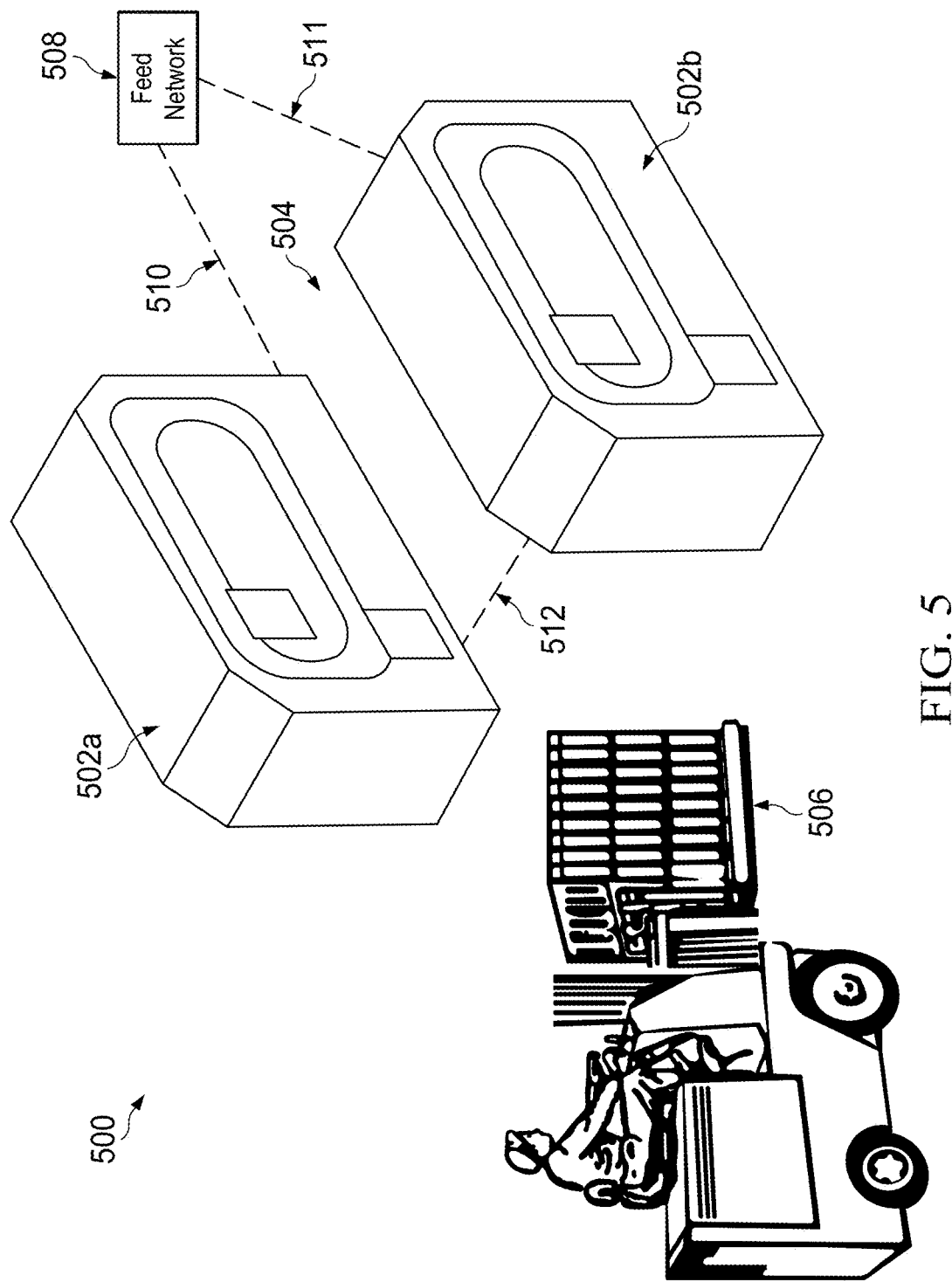
FIG. 5 illustrates an example application of tuned narrowband near-field probes in accordance with this disclosure.

FIG. 5 illustrates an example application 500 of tuned narrowband near-field probes in accordance with this disclosure. As shown in FIG. 5, two probe units 502a-502b are used, where each probe unit 502a-502b includes a transmit probe and a receive probe. The transmit probe of a probe unit 502a-502b may be positioned within the receive probe of the probe unit 502a-502b, or the transmit probe of a probe unit 502a-502b may be positioned around the receive probe of the probe unit 502a-502b. The transmit probes used in the probe units 502a-502b may represent near-field probes, such as the near-field probes 102, 202, 302a-302b, or 402a-402b described above. The probe units 502a-502b are separated by a space to define an inspection area 504, which represents an area in which cargo or other objects 506 to be inspected may be placed. In this example, the cargo is moved into the inspection area 504 by a forklift, although any other suitable mechanism may be used to move objects 506 to be inspected.

In this example, a feed network 508 can include a probe excitation unit, a power amplifier, and other components used to drive the probe units 502a-502b and optionally to process received signals. Cables 510 and 511 couple the feed network 508 to the probe units 502a-502b, and a cable 512 may optionally couple the probe units 502a-502b to each other in series. Given the example environment here, it is possible for some of the cables 510, 511, and 512 to be quite long and (in the absence of the approaches described above) to carry high voltages and currents and produce large electrical losses. The approaches described above can be used to reduce losses in the cables 510, 511, and 512 and to reduce the voltages and currents carried by the cables 510, 511, and 512 (including voltages and currents transported between the probe units 502a-502b).

Although FIG. 5 illustrates one example of an application 500 of tuned narrowband near-field probes, various changes may be made to FIG. 5. For example, any of the approaches described above can be used in any other suitable application. This disclosure is not limited to using the approaches described above in cargo inspection systems or other inspection systems.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
    a near-field probe comprising loops or coils of electrically-conductive material, the near-field probe configured to generate a magnetic field;
    a power amplifier configured to drive the near-field probe;
    a shunt capacitance coupled in parallel across the loops or coils of the near-field probe, wherein the shunt capacitance and an inductance of the loops or coils of the near-field probe form part of a resistive-inductive-capacitive (RLC) network, and wherein the RLC network is configured to transform a smaller resistance of the near-field probe into a larger resistance; and
    multiple cables electrically coupling the power amplifier and the near-field probe;
    wherein the RLC network is configured to increase the resistance of the near-field probe in order to decrease electrical losses associated with the multiple cables.

2. The apparatus of claim 1, wherein the RLC network is configured to increase an electrical current flowing through the near-field probe in response to a drive voltage relative to an amount of current flowing through the near-field probe without the shunt capacitance in response to the drive voltage.

3. The apparatus of claim 1, further comprising:
    a tuning network coupled between the near-field probe and the power amplifier;
    wherein the tuning network comprises multiple tuning capacitors arranged in an L-shaped configuration.

4. The apparatus of claim 3, further comprising:
    a series capacitance coupled in series with the tuning network and the near-field probe;
    wherein the series capacitance is configured to increase a voltage from the power amplifier toward an input terminal of the near-field probe without the tuning capacitors receiving the increased voltage.

5. The apparatus of claim 3, wherein the tuning capacitors are configured to provide variable capacitances in order to support use of different operational frequencies with the near-field probe.

6. The apparatus of claim 1, further comprising:
    a signal source configured to generate an excitation signal;
    wherein the power amplifier is configured to amplify the excitation signal in order to drive the near-field probe.

7. The apparatus of claim 1, wherein the shunt capacitance is coupled to input and output terminals of the near-field probe.

8. An apparatus comprising:
    multiple near-field probes coupled in series, each near-field probe comprising loops or coils of electrically-conductive material and configured to generate a magnetic field;

a power amplifier configured to drive the near-field probes;

for each near-field probe, a shunt capacitance coupled in parallel across the loops or coils of the near-field probe, wherein the shunt capacitance and an inductance of the loops or coils of the near-field probe form part of a resistive-inductive-capacitive (RLC) network, and wherein the RLC network is configured to transform a smaller resistance of the near-field probe into a larger resistance; and multiple cables electrically coupling the power amplifier and the near-field probes and electrically coupling the near-field probes in series;

wherein, for each near-field probe, the RLC network is configured to increase the resistance of the near-field probe in order to decrease electrical losses associated with the multiple cables.

9. The apparatus of claim 8, wherein, for each near-field probe, the RLC network is configured to increase an electrical current flowing through the near-field probe in response to a drive voltage relative to an amount of current flowing through the near-field probe without the shunt capacitance in response to the drive voltage.

10. The apparatus of claim 8, further comprising:
a tuning network coupled between the near-field probes and the power amplifier;
wherein the tuning network comprises multiple tuning capacitors arranged in an L-shaped configuration.

11. The apparatus of claim 10, further comprising:
a series capacitance coupled in series with the tuning network and the near-field probes;
wherein the series capacitance is configured to increase a voltage from the power amplifier toward input terminals of the near-field probes without the tuning capacitors receiving the increased voltage.

12. The apparatus of claim 10, wherein the tuning capacitors are configured to provide variable capacitances in order to support use of different operational frequencies with the near-field probes.

13. The apparatus of claim 8, wherein the RLC networks are further configured to decrease an electrical voltage and an electrical current passing through at least one of the cables that couples the near-field probes in series.

14. The apparatus of claim 8, further comprising:
a signal source configured to generate an excitation signal;
wherein the power amplifier is configured to amplify the excitation signal in order to drive the near-field probes.

15. The apparatus of claim 8, wherein, for each near-field probe, the shunt capacitance is coupled to input and output terminals of the near-field probe.

16. A method comprising:
amplifying an excitation signal using a power amplifier to generate a drive signal for one or more near-field probes, each near-field probe comprising loops or coils of electrically-conductive material;
generating a magnetic field using each near-field probe based on the drive signal; and
for each near-field probe, using a shunt capacitance coupled in parallel across the loops or coils of the near-field probe to form, along with an inductance of the loops or coils of the near-field probe, part of a resistive-inductive-capacitive (RLC) network, wherein the RLC network is configured to transform a smaller resistance of the near-field probe into a larger resistance;
wherein multiple cables electrically couple the power amplifier and the one or more near-field probes; and
wherein the RLC network for each near-field probe is configured to increase the resistance of the near-field probe in order to decrease electrical losses associated with the multiple cables.

17. The method of claim 16, wherein, for each near-field probe, the RLC network associated with the near-field probe increases an electrical current flowing through the near-field probe in response to a drive voltage relative to an amount of current flowing through the near-field probe without the shunt capacitance in response to the drive voltage.

18. The method of claim 16, wherein the tuning capacitors are configured to provide variable capacitances in order to support use of different operational frequencies with the one or more near-field probes.

19. The method of claim 16, wherein:
a tuning network is coupled between the one or more near-field probes and the power amplifier; and
the tuning network comprises multiple tuning capacitors arranged in an L-shaped configuration.

20. The method of claim 19, further comprising:
using a series capacitance coupled in series with the tuning network and the one or more near-field probes to increase a voltage from the power amplifier toward one or more input terminals of the one or more near-field probes without the tuning capacitors receiving the increased voltage.

* * * * *